United States Patent [19]
Rostoker

[11] Patent Number: 5,843,809
[45] Date of Patent: Dec. 1, 1998

[54] LEAD FRAMES FOR TRENCH DRAMS

[75] Inventor: Michael D. Rostoker, Boulder Creek, Calif.

[73] Assignee: LSI Logic Corporation, Milpitas, Calif.

[21] Appl. No.: 590,527

[22] Filed: Jan. 24, 1996

[51] Int. Cl.⁶ .................................................. H01L 21/60
[52] U.S. Cl. .......................................... 438/123; 257/676
[58] Field of Search ................................ 437/220, 217; 257/676, 670

[56] References Cited

U.S. PATENT DOCUMENTS

| | | | |
|---|---|---|---|
| 5,068,712 | 11/1991 | Murakami et al. | |
| 5,086,018 | 2/1992 | Conru et al. | 437/220 |
| 5,150,193 | 9/1992 | Yasuhara et al. | 357/70 |
| 5,162,894 | 11/1992 | Asano et al. | 257/691 |
| 5,200,364 | 4/1993 | Loh | 437/220 |
| 5,319,241 | 6/1994 | Lim | 257/676 |
| 5,432,127 | 7/1995 | Lamson et al. | 437/220 |
| 5,437,405 | 8/1995 | Asanasavest | 228/180.5 |
| 5,455,200 | 10/1995 | Bigler et al. | 437/217 |
| 5,563,443 | 10/1996 | Beng et al. | 257/676 |
| 5,589,420 | 12/1996 | Russell | 437/220 |

OTHER PUBLICATIONS

"Texas Instruments TMX416100DZ 16–Megabit DRAM", Integrated Circuit Engineering Corporation, Report No. SUB 918–03, pp. 1–18, Aug. 1991.

"Hitachi HM51W64800J7 64 MBit DRAM", Integrated Circuit Engineering Corporation, Report No. SUB 9407–04, pp. 1–12, Jul. 1994.

*Primary Examiner*—John Niebling
*Assistant Examiner*—Kevin F. Turner
*Attorney, Agent, or Firm*—Beyer & Weaver, LLP

[57] ABSTRACT

A DIP integrated circuit package is disclosed which includes a trench-type DRAM and an associated non-symmetric lead frame having one or more Y-shaped leads which branch in the direction of die I/O pads. Such non-symmetric lead frames allow multiple use of pin spacing (i.e., one pin may be used to connect to widely spaced I/O pads on the DRAM die). Further, such structures serve to dissipate the generated heat, and thereby reduce noise, in high density trench-type DRAMs, such as 64 Mbit DRAMs. The lead frame is provided as a DIP lead frame which has no die attach pad and is wire bonded to I/O pads of the integrated circuit that are provided along a center line on the chip.

10 Claims, 2 Drawing Sheets

LEAD FRAMES FOR TRENCH DRAMS

BACKGROUND OF THE INVENTION

This invention relates to integrated circuit devices having trench type capacitors. More particularly, the invention relates to trench type DRAMs employing non-symmetric lead frames.

Trench capacitors are employed in "trench capacitor type" dynamic random access memory chips ("DRAMs"). In such DRAMs, each trench capacitor stores a single bit which may be either a 1 or a 0 depending upon whether the capacitor is charged or discharged. Trench capacitors are particularly attractive for DRAM applications because they utilize a substrate's third dimension (i.e., the direction normal to the substrate surface), and therefore occupy only very little area on the top surface of the substrate, while providing a fairly large total surface area for storing charge. While other capacitor structures, such as planar and stacked capacitors, can provide somewhat densely packed devices, trench-based structures generally require even less chip area.

It is believed that to develop 64 megabit or greater trench-type DRAMs, trenches having submicron widths and aspect ratios of at least about 2.5 to 1 (depth to width) must be formed. However, trench capacitors in current 16 megabit DRAMs produced by Texas Instruments Corporation have widths of about 1.5 μm and depths of only about 2.85 μm. Unfortunately, widely used trench forming techniques have not yet proved able to reliably attain the trench depth to width ratios necessary to reach the 64 megabit requirements.

In an effort to provide DRAM capacitors with greater surface area, some companies have employed "fin-type" capacitors. For example, in its 64 megabit DRAM, Hitachi Corporation has employed one fin-type capacitor in each DRAM cell. While providing somewhat increased capacitance on available chip surface area, fin-type capacitors have complex shapes and are therefore somewhat difficult to fabricate. Thus, if possible, it would be desirable to develop increased density DRAMs with the simpler trench-based technology.

It is believed that such DRAMs can, in fact, be produced by advanced techniques such as those described in copending patent applications 08/531,727 (Attorney Docket No. LSI1P036/P2585) entitled IC DEVICE FABRICATION BY PLASMA ETCHING, 08/531,473 (Attorney Docket No. LSI1P033/P2586) entitled INTEGRATED CIRCUIT DEVICE FABRICATION BY PLASMA ETCHING, and 08/531,659 (Attorney Docket No. LFI1P034/P2587) entitled HIGH SURFACE AREA TRENCHES FOR AN INTEGRATED CIRCUIT DEVICE all filed on Sep. 21, 1995 and naming M. Rostoker as inventor (all three incorporated herein by reference for all purposes). Each of these applications describe improved techniques for forming very deep and narrow trenches for use in trench capacitors. The first two of these applications describe plasma etching processes conducted in specialized reactors employing three or more electrodes and special etch conditions which protect trench sidewalls. The three electrodes provide improved control over the plasma uniformity and impact on the substrate. And the sidewall protection provides for a highly anisotropic etch and therefore a very deep and narrow trench. The third application describes a technique for producing high surface area trenches having non-linear sidewalls. Such trenches provide increased capacitance for a given trench depth.

While the above techniques offer the possibility of high density, high capacity DRAMs, other issues may have to be addressed before such high density trench-type DRAMs can be brought to market. For example, trench capacitor type DRAMs carry some current deep within the semiconductor substrate and therefore generate relatively large quantities of heat which must be dissipated. Thus, improved techniques for dissipating heat in trench capacitor type DRAMs should be developed before 64 Mbit versions of these devices can be developed. Further, trench capacitors tend to leak and therefore are susceptible to signal degradation from relatively low levels of noise. Thus, improved mechanisms for reducing on-chip noise should be provided.

The lead frames used in current 16 Mbit trench-type DRAMs produced by both Texas Instruments and Hitachi may be inadequate to address the above problems as applied to 64 Mbit and larger trench-type DRAMs. A lead frame of the type employed in the Texas Instruments and Hitachi 16 Mbit DRAMs is described in U.S. Pat. No. 5,068,712 issued to Murakami et al. on Nov. 26, 1991, and in ICE (Integrated Circuit Engineering) Reports "Texas Instruments TMX416100DZ 16 Megabit DRAM" (report no. SUB 918-03—Aug. 3, 1991) and "Hitachi HM5116100J8 16 Megabit DRAM" (report no. SUB 9204-02—Apr. 2, 1992).

FIG. 1 shows a dual in line package ("DIP") lead frame 2 of the type used in the Texas Instruments and Hitachi 16 Mbit trench-type DRAMs. The lead frame includes power rails 4a and 4b which span the length of the lead frame and terminate in leads 6a, 6b, 6c, and 6d. Typically, the power rails 4a and 4b are used to supply the power (Vdd) and ground (Vss) to the integrated circuit. Note that power rail 4a is connected to a divided lead 8a having pins 10a and 10b. In addition, power rail 4b is connected to a second divided lead 8b terminating in pins 12a and 12b.

The lead frame 2 also includes four groups of five leads each, leads 14 and 16 disposed adjacent to power rail 4b and leads and 18 and 20 disposed adjacent to power rail 4a. As can be seen, all leads are symmetrically arranged with respect to divided leads 8a and 8b and a center line access between the power rails on the integrated circuit. Further, none of these leads electrically contact the power rails.

The integrated circuit to which the lead frame 2 is connected contains a plurality of I/O pads which run parallel to and between power rails 4a and 4b. These I/O pads are electrically coupled to the leads and the power rails via thin wires such as wire 24. The wires are attached to the I/O pads through ball bonds such as ball bond 22. The other ends of the wires are attached to the leads or power rails via, typically, stitch bonds.

In the above system, it should be noted that the DIP lead frame contains no die attach pad (a metal region used to support an integrated circuit in some lead frame designs). By eliminating such die attach pads, this design provides certain advantages, such as resistance to cracking from moisture or thermal effects when resin is introduced to form the package. However, this design can, under some circumstances, reduce heat transfer from the integrated circuit. As noted, trench-type DRAMs generally produce significant quantities of heat which must be dissipated in some manner. Unfortunately, the lead frame of FIG. 1 does not appear designed to optimally dissipate heat generated by a trench-type DRAM.

Further, the symmetric lead frame of FIG. 1 provides only limited flexibility for connecting pins to various I/O pads. That is, the lead frame allows only a single I/O pad (or at most two nearby I/O pads) to be electrically connected to a given pin.

Thus, there exists a need for improved lead frames suitable for high capacity trench-type DRAMs (e.g., 64 Mbit or greater trench-type DRAMs).

SUMMARY OF THE INVENTION

The present invention provides an integrated circuit package including a trench-type DRAM and an associated non-symmetric lead frame having multiple Y-shaped leads which branch toward the I/O pads. Such non-symmetric lead frames allow multiple use of pin spacing (i.e., one pin may be used to connect to widely spaced I/O pads on the DRAM die). Further, such structures better dissipate the heat generated by high-density trench-type DRAMs (e.g., 64 Mbit DRAMs) and thereby reduce noise in such DRAMs. The lead frames used with this invention preferably are provided as dual in line package lead frames which have no die attach pad and are wire bonded to I/O pads aligned along a center line on integrated circuit chips.

One aspect of the invention provides an integrated circuit package that may be characterized as including the following items: (1) a trench-type DRAM integrated circuit die including a plurality of trench capacitors and a plurality of input and output pads aligned generally along a line; (2) a DIP lead frame having two halves aligned in parallel with and on opposite sides of the line of input and output pads, the lead frame halves including a plurality of leads each having a pin end for electrically connecting the integrated circuit to an external element and at least one die connection end for electrically connecting one or more of the input and output pads to the lead frame; and (3) a plurality of bonding wires electrically coupling the input and output pads to at least some of the die connection ends of the plurality of leads. Typically, the DRAM die and at least part of the lead frame are hermetically encapsulated in an encapsulant material.

In such package, at least one of the leads in each lead frame half is a Y-shaped lead which includes at least two die connection ends, at least one of which is electrically connected to one of the input and output pads. Further, the plurality of leads is arranged non-symmetrically with respect to any axis that is perpendicular to the line of input and output pads. This allows for nonuniform spacing of leads along the line of input and output pads, thereby providing some flexibility in the pin connections. In preferred embodiments, at least one Y-shaped lead in each lead frame half is a "branched lead" having a first one of its die connection ends located, in comparison to a second one of its die connection leads, further away from the line of input and output pads.

In further preferred embodiments, the lead frame also includes two power rails that are provided on opposite sides of the plurality of input and output pads, and are aligned in parallel with the line of input and output pads. These power rails are located between the die connection ends of the leads and the plurality of input and output pads. Preferably, each rail includes one or more tabs which extend away from the input and output pads, toward the pin ends of the leads. At least some of the tabs are electrically coupled by bonding wires to input and/or output pads on the trench-type DRAM die.

A second aspect of the present invention provides a method of packaging a trench-type DRAM integrated circuit die having a plurality of trench capacitors and a plurality of input and output pads aligned generally along a single line. The method may be characterized as including the following steps: (1) providing a non-symmetric lead frame of the type described above (e.g., at least one of its leads is a Y-shaped lead); (2) wire bonding a plurality of wires between (a) die connection ends of the lead frame leads and (b) at least some of the input and output pads; and (3) forming a package encasing the integrated circuit and at least a portion of the lead frame. Typically, the step of forming the package involves encapsulating the integrated circuit and at least a portion of the lead frame in an encapsulating material. Further, in preferred embodiments, the step of wire bonding a plurality of wires involves ball bonding the wires to the input and output pads and stitch bonding the wires to the die connection ends of the lead frame leads.

These and other features and advantages of the present invention will be presented in more detail in the following detailed description of the invention and in the associated figures.

DESCRIPTION OF THE PREFERRED EMBODIMENTS

Figure 2:
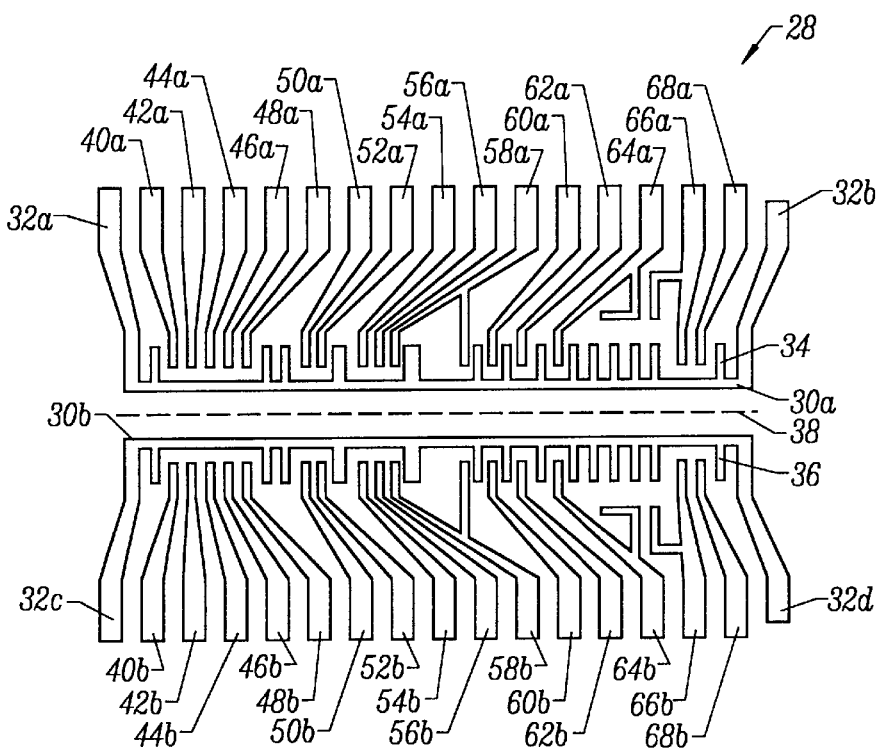
FIG. 2 is a non-symmetric lead frame for use with a trench-type DRAM in accordance with a preferred embodiment of the present invention.

FIG. 2 illustrates a DIP lead frame 28 designed for use with trench-type DRAMs in accordance with this invention. The lead frame includes two parallel power rails 30a and 30b which span most of the length of the lead frame and divide the lead frame into two halves. The power rails are connected to leads 32a, 32b, 32c, and 32d, and include various tabs such as tab 34 on power rail 30a and tab 36 on power rail 30b. These tabs extend a short distance off the main power rail structure toward the remaining leads of the lead frame, in a direction perpendicular to the length of the lead frame.

In addition to the power rails and associated leads 32a, 32b, 32c, and 32d, the lead frame 28 includes several leads that are not in electrical contact with the power rails and are arranged to provide connections to I/O pads which receive and transmit various data signals. These leads include leads 40a, 42a, 44a, 46a, 48a, 50a, 52a, 54a, 56a, 58a, 60a, 64a, 66a, and 68a adjacent to power rail 30a, and leads 40b, 42b, 44b, 46b, 48b, 50b, 52b, 54b, 56b, 58b, 60b, 64b, 66b, and 68b which are adjacent to power rail 30b. The ends of these leads that are closest to the power rails (the die connection ends) are used to electrically connect the lead frame to the I/O pads. And the ends of the leads that are farthrest removed from the power rails (the pin ends) are used to electrically connect the lead frame, and therefore the trench-type DRAM, to external elements such as power supplies, data sources, etc. To support 64 Mbit DRAMs, there should be at least about 30 leads. Typically, the connections to these leads are made by bonding wires conventionally employed-in the art.

The power rails 30a and 30b are aligned in parallel with and straddle a row of I/O pads along a principal axis 38. The I/O pads are provided on an underlying trench-type DRAM (not shown), and generally are aligned substantially along axis 38. The leads generally extend perpendicular to the axis 38. As can be seen, however, at least some of the leads have shapes and orientations that deviate somewhat from being truly perpendicular. For example, leads 62a and 62b have a somewhat slanted midsection; although their die and pin connection ends are in deed perpendicular to the axis 38.

Figure 1:
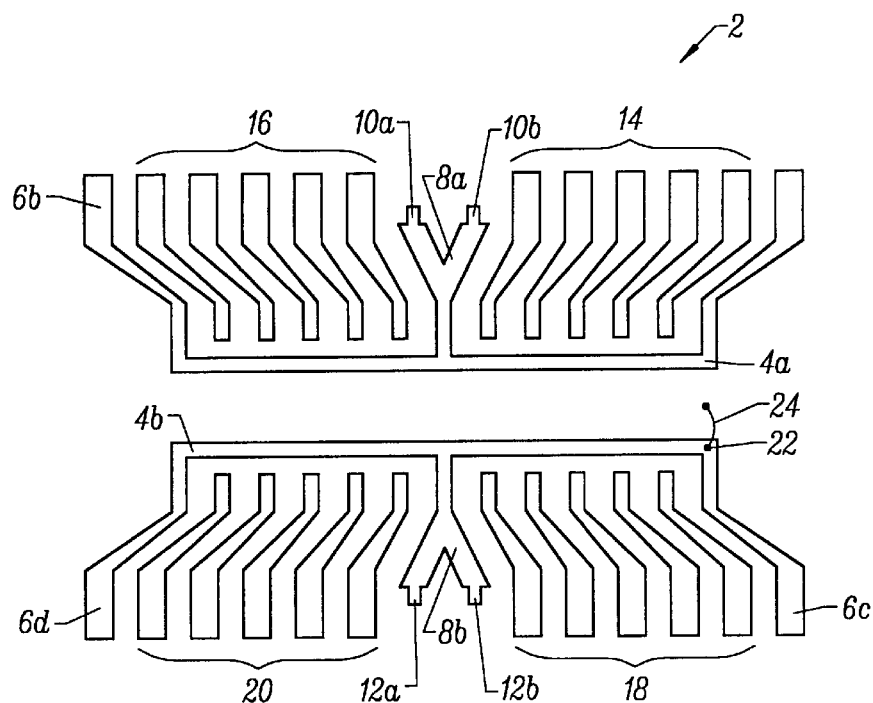
FIG. 1 is a symmetric lead frame of the type used with trench-type DRAMs in conventional packages.

Further, leads 66*a* and 66*b* are Y-shaped with fingers branching toward the principal axis 38. Such Y-shaped leads will be described in more detail below. It is important to note that, unlike the conventional lead frame for trench DRAMs shown in FIG. 1, the lead frame shown in FIG. 2 is non-symmetric about any axis perpendicular to principal axis 38. That is, the various slanted and Y-shaped leads of lead frame 28 are not mirror images of one another, except with respect to principal axis 38.

Another important feature of lead frame 28 is the use of tabs (including tabs 34 and 36) on the power rails 30*a* and 30*b*. Such tabs extend from the power rails in a direction perpendicular to axis 38, and provide multiple sites for wire bonding the power rails to the appropriate I/O pads. As can be seen, the tab sites are spread out over a wide area on the power rail. This facilitates a more even potential distribution across the trench-type DRAM, thereby reducing on-chip noise and improving performance. In addition, the tabs extend away from the I/O pads by a sufficient distance so that their ends are roughly the same distance from the I/O pads as the die connection ends of the leads. This allows the wire bonding process to be performed more easily. Specifically, the tabs such as tabs 34 and 36 which extend from power rails 30*a* and 30*b* provide a bonding surface that is separated from I/O pads on axis 38 by roughly the same distance as between the leads and the I/O pads on axis 38. Thus, a standard wire bonding tool moves by a relatively consistent distance whether making connections to power rails by bonding to the tabs or to other leads by bonding to their die connection ends. Further, by bonding to a tab rather than the power rail itself, the wire bond approach angles are improved, thereby reducing the danger of shorting between wires which cross over one another.

Among the 34 leads on lead frame 28 are six "Y-shaped" leads, each of which terminates in a single pin end, but branches into two or more fingers (die connection ends) pointed toward the I/O pads 38. Specifically, leads 58*a*, 64*a*, and 66*a* (in addition to their mirror image counterparts on the other side of principal axis 38) may be characterized as Y-shaped leads. Such leads provide considerable flexibility by allowing a single pin to connect with two or more widely spaced I/O pads, depending upon the particular application of the trench-type DRAM. Further, lead frames employing such Y-shaped leads can be used with different chip designs; in a first chip design, one finger of a Y-shaped lead is bonded, and in a second chip design the other finger of the Y-shaped lead is bonded. Of course, in any given application, only one of the fingers is electrically connected to an I/O pad.

A subset of these Y-shaped leads are "branched" leads such as leads 64*a*, 64*b*, 66*a*, and 66*b*. Each branched lead has one "shortened" or bent finger that does not extend fully towards the power rails. That is, the die connection ends of the shortened fingers of leads 64*a*, 64*b*, 66*a*, and 66*b* are located, in comparison to their other finger and other non-Y leads, further away from the line of input and output pads (along principal axis 38). Regular Y-shaped leads 58*a* and 58*b*, in contrast, have both fingers extending close to the power rail in the same manner as conventional non-branched leads. A particularly advantage of this structure is the additional heat dissipation it provides. While the shortened fingers on branched leads 64*a*, 64*b*, 66*a*, and 66*b* may not be used for die connection, they do act as heat dissipative fins to help remove some heat generated in trench-type DRAMs, and thereby reduce on-chip noise.

Further, it should be noted that the branched leads are provided next to one another and oriented such that their shortened fingers face one another (see for example branched leads 64*a* and 66*a*). This frees up substantial room on the region of the power rail lying immediately below the shortened fingers. As shown, this space is occupied by four tabs on each of rails 30*a* and 30*b*. Hence more connections can be made at more locations on the power rails.

Figure 3:
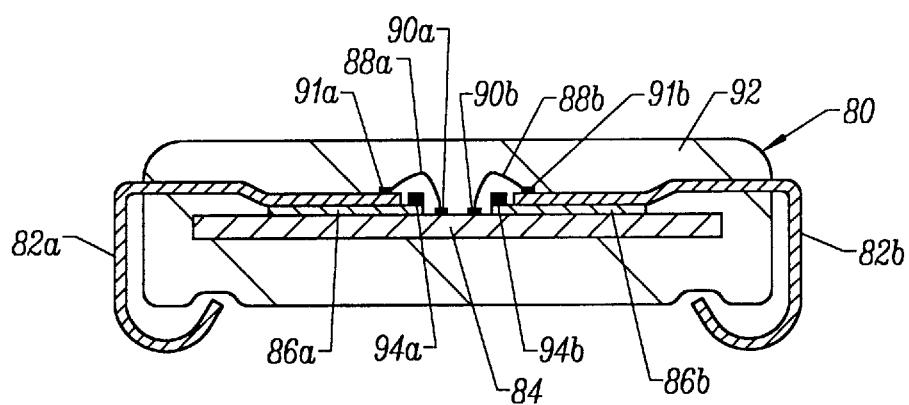
FIG. 3 is a cross-sectional view of a trench-type DRAM package in accordance with a preferred embodiment of this invention.

FIG. 3 is cross-sectional illustration of an integrated circuit package employing a trench type DRAM and a lead frame in accordance with the present invention. Such integrated circuit package 80 includes leads 82*a* and 82*b* which are electrically connected to trench-type DRAM 84. As shown, the leads 82*a* and 82*b* are bent in a "J" shape conventionally employed in small outline J type packages ("SOJ"). The leads 82*a* and 82*b* are affixed to the integrated circuit 84 by insulating adhesive layers 86*a* and 86*b* respectively, and are electrically connected to the I/O pads of integrated circuit 84 by wire bonds including a wires 88*a* and 88*b*, ball bonds 90*a* and 90*b*, and stitch bonds 91*a* and 91*b*. In addition, the structure includes power rails 94*a* and 94*b* which are also affixed to the integrated circuit 84 by the insulating adhesive layers 86*a* and 86*b*. The trench-type DRAM 84 and at least a portion of said lead frame is hermetically encased in an encapsulant material such as resin package 92. As indicated by the positions of the ball bonds, the I/O pads of DRAM 84 generally are staggered along a straight line between power rails 94*a* and 94*b*.

In the trench-type DRAMs used with lead frames of this invention (e.g., DRAM 84), a trench capacitor forms part of a single memory cell that also includes an active device such as an MOS transistor. More specifically, a memory cell typically includes one of said trench capacitors and a pass transistor connected in series. Multiple memory cells are arranged in a predefined circuit configuration to form the DRAM. Specifically, in each cell, the transistor's gate is connected to a word line, one transistor drain/source is connected to a first plate of the trench capacitor (e.g., the semiconductor substrate), and the other drain/source is connected to a bit line. Such cells may be formed on a single DRAM chip capable of storing at least 64 Mbit, and more preferably at least a gigabit of data. In some cases, the DRAMs or other integrated circuits used in accordance with this invention are provided as part of a digital system having a plurality of semiconductor integrated circuits. For example, the system may be multichip memory module.

In accordance with the present invention, a DRAM package of this invention generally is produced using conventional techniques. First, a trench-type DRAM die is attached to a non-symmetric lead frame of this invention using an electrically non-conductive adhesive. Thereafter, the I/O pads on the DRAM die are wire bonded to corresponding die connection points on the non-symmetric lead frame. In practice, the various leads and tabs on the lead frame are bonded to the I/O pads along the above-described principal axis by thin wires using conventional methods. Typically, as shown in FIG. 3, a ball bond is formed with the wire on the die I/O pad and a stitch bond is formed with the wire on the die connection portion of a lead or tab. After the wire bonding is completed, a flowable encapsulant material such as a resin is provided to the die and at least the die connection portions of the lead frame (by, for example, injecting into a mold) and allowed to harden, thereby providing an integrated circuit package in accordance with this invention.

Although the foregoing invention has been described in some detail for purposes of clarity of understanding, it will be apparent that certain changes and modifications may be practiced within the scope of the appended claims. For instance, although the specification has described a lead frame having 6 Y-shaped leads other lead frames using more or fewer Y-shaped leads may be used as well. In addition, the reader will understand that the non-symmetric lead frames described herein can be advantageously used in all trench-type DRAMs regardless of the total storage capacity. For example, the lead frames here taught may be used with 16 Mbit trench-type DRAMs and their equivalent within the scope of this invention.

What is claimed is:

1. A method of packaging a trench-type DRAM integrated circuit die having a plurality of trench capacitors and a plurality of input and output pads aligned generally along a single line, a method comprising the following steps:

providing a DIP lead frame having two halves aligned in parallel with and on opposite sides of said line of input and output pads, the lead frame halves including a plurality of leads each having a pin end for electrically connecting said integrated circuit to an external element and at least one die connection end for electrically connecting one or more of said input and output pads to the lead frame, at least one of said leads in each lead frame half being a Y-shaped lead which includes at least two die connection ends, at least one of which is electrically connected to one of said input and output pads, and none of said leads being arranged symmetrically over the entire lead frame with respect to any lead frame axis that is perpendicular to the line of input and output pads;

wire bonding a plurality of wires between (a) die connection ends of the lead frame leads and (b) at least some of the input and output pads; and forming a package encasing the integrated circuit and at least a portion of said lead frame.

2. The method of claim 1 wherein at least one Y-shaped lead in each lead frame half provided in the first step is a branched lead having a first die connection end located, in comparison to a second die connection end, further away from the line of input and output pads.

3. The method of claim 1 wherein the lead frame provided in the first step includes two power rails that are provided on opposite sides of the plurality of input and output pads, and are aligned in parallel with the line of input and output pads.

4. The method of claim 3 wherein the power rails of the lead frame provided in the first step are located between said die connection ends of the leads and said plurality of input and output pads.

5. The method of claim 4 wherein the power rails include one or more tabs extending away from said input and output pads.

6. The method of claim 5 wherein in the step of wire bonding at least some of the plurality of wires are bonded between said tabs and at least some of the input and output pads on the DRAM integrated circuit die.

7. The method of claim 1 wherein the step of forming a package includes a step of encapsulating the integrated circuit and at least a portion of said lead frame in an encapsulating material.

8. The method of claim 1 wherein in the step of wire bonding a plurality of wires, the wires are bonded to the input and output pads by ball bonding.

9. The method of claim 1 wherein in the step of wire bonding a plurality of wires, the wires are bonded to the die connection ends of the lead frame leads by stitch bonding.

10. A method of packaging a trench-type DRAM integrated circuit die having a plurality of trench capacitors and a plurality of input and output pads aligned generally along a single line, the method comprising the following steps:

providing a DIP lead frame having two halves aligned in parallel with and on opposite sides of said line of input and output pads, the lead frame halves including a plurality of leads each having a pin end for electrically connecting said integrated circuit to an external element and at least one die connection end for electrically connecting one or more of said input and output pads to the lead frame, none of said leads being arranged symmetrically over the entire lead frame with respect to any lead frame axis that is perpendicular to the line of input and output pads, said lead frame includes two power rails that are provided on opposite sides of the plurality of input and output pads and are aligned in parallel with the line of input and output pads and located between said die connection ends of the leads and said plurality of input and output pads, said power rails include one or more tabs extending away from said input and output pads and at least two of said leads in each lead frame half being Y-shaped leads each including at least two die connection ends, at least one of which is electrically connected to one of said input and output pads and some of said Y-shaped leads are branched leads having a first die connection end located further away from the input and output pads in comparison to a second die connection end, said branched leads having shortened leads, which face each other and do not extend fully towards said power rails;

wire bonding a plurality of wires between die connection ends of the lead frame leads and at least some of the input and output pads and between said tabs and at least some of the input and output pads on the DRAM integrated circuit die; and forming a package encasing the integrated circuit and at least a portion of said lead frame.

* * * * *